(12) United States Patent
Daido et al.

(10) Patent No.: US 6,896,967 B2
(45) Date of Patent: *May 24, 2005

(54) ULTRAVIOLET-CURABLE RESIN COMPOSITION AND PHOTOSOLDER RESIST INK CONTAINING THE COMPOSITION

(75) Inventors: Hiroko Daido, Kyoto (JP); Soichi Hashimoto, Kyoto (JP)

(73) Assignee: Goo Chemical Co., Ltd., Uji (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/363,855

(22) PCT Filed: Sep. 14, 2001

(86) PCT No.: PCT/JP01/07986
§ 371 (c)(1),
(2), (4) Date: Jul. 23, 2003

(87) PCT Pub. No.: WO02/25378
PCT Pub. Date: Mar. 28, 2002

(65) Prior Publication Data
US 2004/0006161 A1 Jan. 8, 2004

(30) Foreign Application Priority Data
Sep. 16, 2000 (JP) ........................................ 2000-321976
Sep. 18, 2000 (JP) ........................................ 2000-282545
Dec. 8, 2000 (JP) ........................................ 2000-375131

(51) Int. Cl.$^7$ .............................. B32B 27/38; C08L 63/00
(52) U.S. Cl. ...................... 428/413; 428/901; 522/100; 522/103; 522/170; 522/181; 525/529; 525/530; 525/533; 430/280.1; 430/281.1; 430/286.1
(58) Field of Search ................................. 428/416, 418, 428/901, 413, 414; 522/100, 101, 103, 170, 181; 528/306; 525/925, 523, 524, 529, 530, 532, 533; 430/75, 80, 269, 270.1, 280.1, 281.1, 286.1, 287.1, 288.1

(56) References Cited

U.S. PATENT DOCUMENTS

| 5,539,064 A | 7/1996 | Hashimoto et al. |
| 5,858,618 A | 1/1999 | Tzou |
| 6,465,540 B1 * | 10/2002 | Kubo et al. .................. 522/100 |

FOREIGN PATENT DOCUMENTS

| EP | 0 733 683 A1 | 9/1996 |
| EP | 0 864 926 A1 | 9/1998 |
| EP | 0 919 873 A1 | 6/1999 |
| EP | 1037111 | 9/2000 |
| JP | 06-093221 | 4/1994 |
| JP | 7-207211 | 8/1995 |
| JP | 8-274445 | 10/1996 |
| JP | 9-5997 | 1/1997 |

* cited by examiner

Primary Examiner—Michael J. Feely
(74) Attorney, Agent, or Firm—Oblon, Spivak, McClelland, Maier & Neustadt, P.C.

(57) ABSTRACT

An ultraviolet curable resin composition comprises (A) an ultraviolet curable resin obtained by reacting an epoxy group containing polymer (a), which is prepared by polymerizing an ethylenically unsaturated monomer component including an ethylenically unsaturated monomer (i) having an epoxy group, with an ethylenically unsaturated monomer (b) having a carboxyl group, and then reacting a resultant intermediate product with a saturated or unsaturated polybasic acid anhydride (c); (B) an epoxy compound having at least two epoxy groups in molecule; (C) a photopolymerization initiator; and (D) a diluent The ultraviolet curable resin includes 0.3 to 10 mol of a polymerizable unsaturated group in 1 kg thereof. A photo solder resist ink containing this resin composition has the capability of providing a permanent film with excellent flexibility and solder heat resistance, and is preferably used to manufacture flexible printed circuit boards.

15 Claims, No Drawings

ULTRAVIOLET-CURABLE RESIN COMPOSITION AND PHOTOSOLDER RESIST INK CONTAINING THE COMPOSITION

TECHNICAL FIELD

The present invention relates to an ultraviolet curable resin composition having the capability of forming a cured film with excellent flexibility and solder heat resistance, and a photo solder resist ink including the same resin composition.

BACKGROUND ART

In recent years, demand for flexible printed circuit boards using a film-like substrate such as a polyester film or a polyimide film is growing. However, there is a problem that a permanent film formed by use of a conventional photo solder resist ink developable with a diluted alkali aqueous solution is poor in flexibility despite good solder heat resistance. Due to this reason, it has been difficult to use the resist ink to the flexible printed circuit board (FPC) requiring the flexibility.

For example, photo solder resist inks available to manufacture the flexible printed circuit boards were proposed in Japanese Patent Early Publication [kokai] Nos. 7-207211, 8-274445 and 9-5997. However, sufficient flexibility has not been achieved yet. In addition, there is a case of lowering the solder heat resistance when trying to improve the flexibility. Thus, the photo solder resist ink having sufficient performance has not been obtained under the present circumstances.

SUMMARY OF THE INVENTION

In view of the above problems, a concern of the present invention is to provide an ultraviolet curable resin composition having the capability of forming a cured film with good flexibility as well as improved solder heat resistance. That is, the ultraviolet curable resin composition of the present invention comprises:

(A) an ultraviolet curable resin obtained by reacting an epoxy group containing polymer (a), which is prepared by polymerizing an ethylenically unsaturated monomer component including an ethylenically unsaturated monomer (i) having an epoxy group and a compound (ii) having at least two ethylenically unsaturated groups in one molecule, with an ethylenically unsaturated monomer (b) having a carboxyl group, and then reacting a resultant intermediate product with a saturated or unsaturated polybasic acid anhydride (c), the ultraviolet curable resin including 0.3 to 10 mol of a polymerizable unsaturated group in 1 kg thereof;

(B) an epoxy compound having at least two epoxy groups in molecule;

(C) a photopolymerization initiator; and (D) a diluent.

A further concern of the present invention is to provide a photo solder resist ink including the above resin composition. This photo solder resist ink is optimum to manufacture flexible printed circuit boards, and can provide a permanent film having excellent flexibility and solder heat resistance.

Another concern of the present invention is to provide a flexible printed circuit board or a printed circuit board, which has a permanent film formed by use of the above-described photo solder resist ink.

Still another concern of the present invention is to provide a dry film obtained by forming a film of the ultraviolet curable resin composition or the photo solder resist ink described above on a support. This dry film can provide a permanent film having excellent flexibility and solder heat resistance to the printed circuit board or the flexible printed circuit board.

These and still other objects and advantages of the present invention will become apparent from the best mode for carrying out the invention explained below referring to the attached drawings.

BEST MODE FOR CARRYING OUT THE INVENTION

An ultraviolet curable resin (A) used in the present invention is an ultraviolet curable resin obtained by reacting an epoxy group containing polymer (a), which is prepared by polymerizing an ethylenically unsaturated monomer component including an ethylenically unsaturated monomer (i) having an epoxy group, with an ethylenically unsaturated monomer (b) having a carboxyl group, and then reacting a resultant intermediate product with a saturated or unsaturated polybasic acid anhydride (c). The ultraviolet curable resin includes 0.3 to 10 mol of a polymerizable unsaturated group in 1 kg thereof.

As the epoxy group containing polymer (a), it is possible to use a copolymer obtained by polymerizing the ethylenically unsaturated monomer component, which includes the ethylenically unsaturated monomer (i) having the epoxy group and an ethylenically unsaturated monomer (iii) copolymerizable with this monomer (i).

In addition, as the epoxy group containing polymer (a), it is possible to use a copolymer obtained by polymerizing the ethylenically unsaturated monomer component, which includes the ethylenically unsaturated monomer (i) having the epoxy group and a compound (ii) having at least two ethylenically unsaturated groups in one molecule.

Moreover, as the epoxy group containing polymer (a), it is possible to use a copolymer obtained by polymerizing the ethylenically unsaturated monomer component, which includes the ethylenically unsaturated monomer (i) having the epoxy group, a compound (ii) having at least two ethylenically unsaturated groups in one molecule, and an ethylenically unsaturated monomer (iii) copolymerizable with them.

When using the ethylenically unsaturated monomer component not including the compound (ii) and the ethylenically unsaturated monomer (iii), it is preferred that a content of the ethylenically unsaturated monomer (i) is 100 mol % with respect to a total amount of the ethylenically unsaturated monomer component used to prepare the epoxy group containing polymer (a).

The ethylenically unsaturated monomer (i) brings the epoxy group in the epoxy group containing polymer (a). By the addition of the ethylenically unsaturated monomer having the carboxyl group, photocurability resulting from an ethylenically unsaturated double bond is given to the epoxy group containing polymer (a).

As the ethylenically unsaturated monomer (i), for example, it is possible to use glycidyl (meth)acrylate, an epoxy cyclohexyl derivative of (meth)acrylic acid such as (3,4-epoxy cyclohexyl)methyl (meth)acrylate, an alicyclic epoxy derivative of (meth)acrylate, β-methylglycidyl (meth) acrylate and monoallyl diglycidyl isocyanurate. One of these compounds or a combination thereof can be used as the ethylenically unsaturated monomer (i). In particular, it is preferred to use glycidyl (meth)acrylate that is easy to get. In the present specification, "(meth)acrylic acid" is a generic name for "acrylic acid" and "methacrylic acid", and "(meth)acrylic-" is a generic name for "acrylic-" and "methacrylic-".

The compound (ii) is an optional component used for the purpose of further improving heat resistance and softening point of the ultraviolet curable resin composition of the present invention. In the case of using the compound (ii), it is preferred that a content of the compound (ii) is within a range of 0.1 to 10 mol % with respect to a total amount of the ethylenically unsaturated monomer component used to prepare the epoxy group containing polymer (a). In this range, the polymerization for generating the epoxy group containing polymer (a) can proceed under a preferred condition. In particular, it is effective to prevent gelation. In addition, a cured film formed by the ultraviolet curable resin composition of the present invention exhibits excellent heat resistance. When using the cured film as a solder resist, excellent solder heat resistance can be obtained. When the content is within a range of 0.1 to 7 mol %, there is an advantage that both of improved heat resistance and good polymerization can be simultaneously achieved.

As the compound (ii) having at least two ethylenically unsaturated groups in one molecule, for example, it is possible to use a compound having two ethylenically unsaturated groups in one molecule such as diethylene glycol di(meth)acrylate, triethylene glycol di(meth)acrylate, polyethylene glycol di(meth)acrylate, propylene glycol di(meth)acrylate, tripropylene glycol di(meth)acrylate, polypropylene glycol di(meth)acrylate, EOPO-denatured di(meth)acrylate, bisphenol AEO adduct di(meth)acrylate, bisphenol FEO adduct di(meth)acrylate, bisphenol APO adduct di(meth)acrylate, bisphenol AEOPO adduct di(meth)acrylate, 1,6-hexanediol di(meth)acrylate, neopentyl glycol di(meth)acrylate, trimethylol propane di(meth)acrylate, cyclopentanyl di(meth)acrylate, or cyclopentenyl di(meth)acrylate, and diallyl monoglycidyl isocyanurate.

In addition, it is possible to use a compound having three or more of ethylenically unsaturated groups in one molecule such as trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, di-, tri- or more polyester obtained by a reaction between a polybasic acid and hydroxyalkyl (meth)acrylate, and polyester (meth)acrylate. One of these compounds or a combination thereof can be used as the compound (ii).

When the epoxy group containing polymer (a) contains the above-described compound (ii), its principal chain is reinforced, so that effects of improving the solder heat resistance, developing width and regulating the softening point can be achieved. The developing width means a width of predrying condition, in which developability can be maintained, and is also called a predrying control width or predrying acceptable range.

Specifically, it is preferred to use di(meth)acrylate as the compound (ii). As di(meth)acrylate, for example, it is particularly preferred to use a compound having at least one oxyalkylene unit in molecule such as oxyethylene or oxypropylene. In this case, it is possible to improve the solder heat resistance of the ultraviolet curable resin composition of the present invention, and particularly provide excellent developing width. It is preferred that the number of oxyalkylene unit in one molecule of di(meth)acrylate is within a range of 1 to 40, preferably 4 to 30, and more preferably 4 to 10. When this condition is satisfied, the reaction of preparing the ultraviolet curable resin (A) stably proceeds, so that the developing width of the ultraviolet curable resin composition increases, and the solder heat resistance of a cured film thereof is improved.

In addition, when using di(meth)acrylate having the oxyalkylene unit and a bisphenol skeleton, it is possible to provide remarkably improved solder heat resistance and developing width.

As di(meth)acrylate having the oxyalkylene unit available as the compound (ii), it is possible to use polyethylene glycol dimethacrylate or ethylene glycol dimethacrylate, which is represented by the following general formula (1):

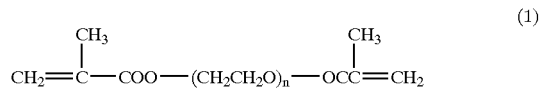

wherein a value of "n" in the formula is an integer selected from a range of 1 to 40.

Alternatively, it is possible to use polypropylene glycol dimethacrylate or propylene glycol dimethacrylate, which is represented by the following general formula (2):

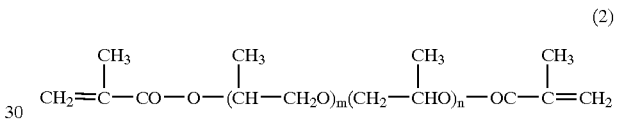

wherein values of "n" and "m" in the formula are respectively an integer of 0 or more determined such that a sum of "n" and "m" is within a range of 1 to 40.

In addition, it is possible to use polyethylene glycol diacrylate or ethylene glycol diacrylate, which is represented by the following general formula (3):

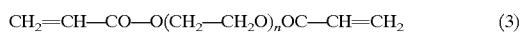

wherein a value of "n" in the formula is an integer selected from a range of 1 to 40.

In addition, as the di(meth)acrylate having the oxyalkylene unit and the bisphenol skeleton, it is possible to use a compound represented by the following general formula (4).

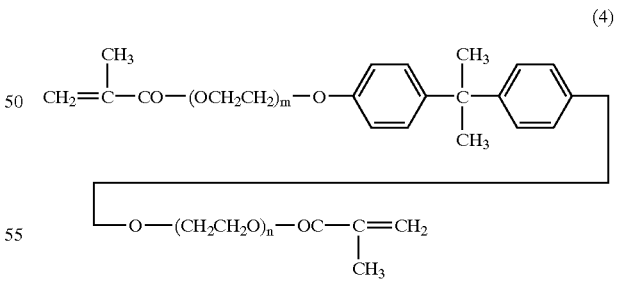

wherein values of "n" and "m" in the formula are respectively an integer of 0 or more determined such that a sum of "n" and "m" is within a range of 1 to 40. As such a compound, for example, it is possible to use 2,2-bis[4-(methacryloxy ethoxy)phenyl]propane, 2,2,-bis[4-(methacryloxy.diethoxy)phenyl]propane, 2,2-bis[4-(methacryloxy.polyethoxy)phenyl]propane, or the like.

Alternatively, it is possible to use a compound represented by the following general formula (5):

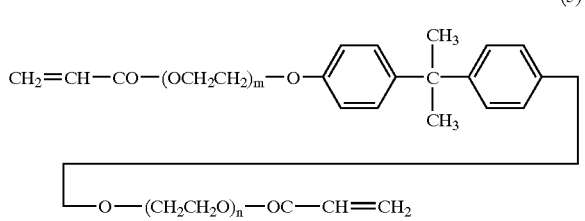

wherein values of "n" and "m" in the formula are respectively an integer of 0 or more determined such that a sum of "n" and "m" is within a range of 1 to 40. For example, as such a compound, it is possible to use 2,2-bis[4-(acryloxy ethoxy)phenyl]propane, 2,2-bis[4-(acryloxy.diethoxy) phenyl]propane, 2,2-bis[4-(acryloxy.polyethoxy)phenyl] propane, bisphenol-A polyethylene glycol polypropylene glycol adduct dimethacrylate, or the like.

Specifically, as the di(meth)acrylate having oxyalkylene unit, for example, it is possible to use "NK Ester 4G" represented by the formula (1) [manufactured by SHINNAKAMURA CHEMICAL INDUSTRIAL CO., LTD., polyethylene glycol #200 dimethacrylate (average value of "n": 4)], "NK Ester 9G" represented by the formula (1) [manufactured by SHINNAKAMURA CHEMICAL INDUSTRIAL CO., LTD., polyethylene glycol #400 dimethacrylate (average value of "n": 9)], "NK Ester 9PG" represented by the formula (2) [manufactured by SHINNAKAMURA CHEMICAL INDUSTRIAL CO., LTD., polypropylene glycol #400 dimethacrylate (average value of "m+n": 7)], "NK Ester A-200" represented by the formula (3) [manufactured by SHINNAKAMURA CHEMICAL INDUSTRIAL CO., LTD., polyethylene glycol #200 diacrylate (average value of "n": 4)], "NK Ester A-400" represented by the formula (3) [manufactured by SHINNAKAMURA CHEMICAL INDUSTRIAL CO., LTD., polyethylene glycol #400 diacrylate (average value of "n": 9)], and "NK Ester A-600" expressed by the formula (3) [manufactured by SHINNAKAMURA CHEMICAL INDUSTRIAL CO., LTD., polyethylene glycol #600 diacrylate (average value of "n": 14)].

On the other hand, as the di(meth)acrylate having oxyalkylene unit and bisphenol skeleton, for example, it is possible to use "NK Ester-BPE-100" represented by the formula (4) [manufactured by SHINNAKAMURA CHEMICAL INDUSTRIAL CO., LTD., 2,2-bis[4-(methacryloxy ethoxy)phenyl]propane (average value of "n+m": 2.6)], "NK Ester-BPE-200" represented by the formula (4) [manufactured by SHINNAKAMURA CHEMICAL INDUSTRIAL CO., LTD., 2,2-bis[4-(methacryloxy.diethoxy)phenyl]propane (average value of "n+m": 4)], "NK Ester-BPE-500" represented by the formula (4) [manufactured by SHINNAKAMURA CHEMICAL INDUSTRIAL CO., LTD., 2,2-bis[4-(methacryloxy.polyethoxy)phenyl]propane (average value of "n+m": 10)], "NK Ester A-BPE-4" represented by the formula (5) [manufactured by SHINNAKAMURA CHEMICAL INDUSTRIAL CO., LTD., 2,2-bis[4-(acryloxy.diethoxy)phenyl]propane (average value of "n+m": 4)], and "Blemmer 43 DB-40B" [manufactured by NOF Corp., bisphenol-A polyethylene glycol polypropylene glycol adduct dimethacrylate].

The ethylenically unsaturated monomer (iii) copolymerizable with the ethylenically unsaturated monomer (i) having the epoxy group and the compound (ii) having at least two ethylenically unsaturated groups in one molecule is an optional component, which is used to control the photocurability of the ultraviolet curable resin composition of the present invention and solid state properties of a cured film thereof, if necessary.

The ethylenically unsaturated monomer (iii) is not specifically limited. For example, it is possible to use a straight-chained or branch-chained alkyl ester of (meth)acrylic acid, (meth)acrylic acid alicyclic ester (an unsaturated bond may be included in the ring.) such as methyl (meth)acrylate, ethyl (meth)acrylate, propyl (meth)acrylate, butyl (meth)acrylate, isobutyl (meth)acrylate, t-butyl (meth)acrylate, 2-ethyl hexyl (meth)acrylate, n-octyl (meth)acrylate, n-decyl (meth) acrylate, isodecyl (meth)acrylate, lauryl (meth)acrylate, myristyl (meth)acrylate, cetyl (meth)acrylate, stearyle (meth)acrylate, cyclohexyl (meth)acrylate, and isobornyl (meth)acrylate, ethylene glycol ester (meth)acrylate such as hydroxy ethyl (meth)acrylate, methoxy ethyl (meth)acrylate, ethoxy ethyl (meth)acrylate, diethylene glycol mono(meth) acrylate, triethylene glycol mono(meth)acrylate and methoxy diethylene glycol mono(meth)acrylate, propylene glycol (meth)acrylate, butylene glycol mono(meth)acrylate, glycerol mono(meth)acrylate, or aromatic (meth)acrylate such as benzyl (meth)acrylate, a (meth)acrylamide compound such as (meth)acrylamide, N-methyl (meth) acrylamide, N-propyl (meth)acrylamide, N-t-butyl (meth) acrylamide, N-t-octyl (meth)acrylamide and diacetone (meth)acrylamide, a maleimide compound such as N-phenyl maleimide, N-(2-methyl phenyl)maleimide, N-cyclohexyl maleimide, N-(2,6-diethyl phenyl)maleimide, N-lauryl maleimide and N-benzyl maleimide, vinyl pyrrolidone, (meth)acrylonitrile, vinyl acetate, styrene, α-methyl styrene, or vinyl ether. One of these compounds or a combination thereof can be used as the ethylenically unsaturated monomer (iii).

In particular, it is preferred to use the straight-chained or branch-chained alkyl ester of (meth)acrylic acid, (meth) acrylic acid fatty ester, (meth)acrylic acid aromatic ester, (meth)acrylic acid alicyclic ester (an unsaturated bond may be included in the ring.), hydroxyalkyl (meth)acrylate, alkoxyalkyl (meth)acrylate, or the maleimide compound because it becomes easy to control the hardness of a film of the ultraviolet curable resin composition, the oiliness thereof, and the hardness of a finally-formed resist.

When using the ethylenically unsaturated monomer (iii), it is preferred that a content thereof is within a range of 1 to 60 mol %, preferably 1 to 55 mol %, and more preferably 10 to 50 mol % with respect to the total amount of the ethylenically unsaturated monomer component. In this range, it is possible to bring a sufficient amount of ethylenically unsaturated groups into the ultraviolet curable resin (A). In addition, it becomes easy to control the hardness and hydrophilicity of the cured film.

The epoxy group containing polymer (a) can be prepared according to a conventional polymerization method such as solution polymerization or emulsion polymerization. For example, when adopting the solution polymerization, a polymerization initiator is added to the ethylenically unsaturated monomer component including the ethylenically unsaturated monomer (i) and if necessary the ethylenically unsaturated monomer (iii) and the compound (ii) in the presence of a suitable organic solvent. Then, a resultant mixture is heated in a nitrogen gas flow, while being agitated. Alternatively, a polymerization method may be performed under a reflux.

As the organic solvent used in the above polymerization, for example, it is possible to use ketone such as methyl ethyl ketone and cyclohexanone, aromatic hydrocarbon such as toluene and xylene, acetic ester such as ethyl acetate, butyl acetate, cellosolve acetate, butyl cellosolve acetate, butyl carbitol acetate and propylene glycol monomethyl ether acetate, or dialkyl glycol ether. One of these compounds or a mixture thereof can be used as the organic solvent.

As the polymerization initiator for polymerization, for example, it is possible to use a peroxide such as t-butyl hydroperoxide, di-t-butyl peroxide, lauroyl peroxide, benzoyl peroxide and di-isopropyl peroxy dicarbonate, or an azo compound such as azobisisobutylonitrile, 2,2'-azobisisomethyl butyrate and azobiscyanovaleronitrile. One of these compounds or a combination thereof can be used as the polymerization initiator.

The ultraviolet curable resin (A) can be obtained by reacting the epoxy group containing polymer (a) with the ethylenically unsaturated monomer (b) having the carboxyl group, and then carrying out a reaction of adding the saturated or unsaturated polybasic acid anhydride (c) to the resultant intermediate product.

As the ethylenically unsaturated monomer (b) having carboxyl group, for example, it is possible to use (meth) acrylic acid, crotonic acid, cinnamic acid, a compound having a single ethylenically unsaturated group such as 2-(meth)acryloyloxyethyl succinic acid, 2-(meth) acryloyloxyethyl phthalic acid, β-carboxyethyl acrylate, acryloyloxyethyl succinate, 2-propenoic acid, 3-(2-carboxyethoxy)-3-oxopropyl ester, 2-(meth) acryloyloxyethyl tetrahydrophthalic acid, and 2-(meth) acryloyloxyethyl hexahydrophthalic acid, or a compound having a plurality of ethylenically unsaturated groups, e.g., a compound obtained by reacting a dibasic acid anhydride with a polyfunctional acrylate having hydroxyl group such as dipentaerythritol penta(meth)acrylate, trimethylolpropane di(meth)acrylate, pentaerythritol tri(meth)acrylate. One of these compounds or a combination thereof as the ethylenically unsaturated monomer (b). It is preferred to use the compound having the single carboxyl group, and particularly (meth)acrylic acid, or a compound containing (meth)acrylic acid as the main ingredient. A reason for using (meth)acrylic acid as the ethylenically unsaturated monomer (b) is in that the ethylenically unsaturated group supplied from (meth)acrylic acid is excellent in photoreactivity.

It is preferred that a compounding amount of the ethylenically unsaturated monomer (b) is determined such that an amount of carboxyl group of ethylenically unsaturated monomer (b) per 1 mol of epoxy group of the epoxy group containing polymer (a) used to prepare the ultraviolet curable resin (A) is within a range of 0.7 to 1.2 mol, preferably 0.9 to 1.1 mol, and more preferably 0.95 to 1.1 mol. In the above range, the ultraviolet curable resin composition of the present invention can provide a remarkably wide developing width. In addition, it is possible to minimize an influence of the remaining ethylenically unsaturated monomer (b) having unreacted carboxyl group.

As the saturated or unsaturated polybasic acid anhydride (c), for example, it is possible to use a dibasic acid anhydride such as succinic anhydride, methyl succinic anhydride, maleic anhydride, citraconic anhydride, glutaric anhydride, itaconic anhydride, phthalic anhydride, tetrahydrophthalic anhydride, methyl tetrahydrophthalic anhydride, methyl nadic acid anhydride, hexahydrophthalic anhydride, and methyl hexahydrophthalic anhydride, or a polybasic acid anhydride such as trimellitic acid anhydride, pyromellitic acid anhydride, benzophenone tetracarboxylic anhydride and methyl cyclohexene tetracarboxylic anhydride. One of these compounds or a combination thereof can be used as the polybasic acid anhydride (c).

The principal purpose of compounding the saturated or unsaturated polybasic acid anhydride (c) is to provide an acid value to the ultraviolet curable resin (A) such that the ultraviolet curable resin has re-dispersion and re-dissolution properties with a diluted alkaline aqueous solution as well as thermosetting property. It is preferred that a compounding amount of the polybasic acid anhydride (c) is determined such that the acid value of the ultraviolet curable resin obtained by the addition of the polybasic acid anhydride (c) is within a range of 25 to 150 mgKOH/g, and particularly 45 to 100 mgKOH/g. In this range, the ultraviolet curable resin composition of the present invention exhibits good developing property, and a cured film formed thereby is excellent in electric properties, electrical corrosion resistance, and water resistance. When the acid value is within the range of 50 to 85 mgKOH/g, particularly preferred results are obtained.

The addition reactions of the ethylenically unsaturated monomer (b) having the carboxyl group to the copolymer and the saturated or unsaturated polybasic acid anhydride (c) can be performed by a conventional method. For example, the addition reaction of the ethylenically unsaturated monomer (b) can be performed by adding the ethylenically unsaturated monomer (b), methoxy hydroquinone as a thermal polymerization inhibitor and a catalyst such as a tertiary amine, quaternary ammonium salt or triphenyl stibine to the epoxy group containing polymer (a), mixing and agitating a resultant mixture, and reacting the mixture at a reaction temperature of 60 to 150° C., and preferably 80 to 120° C. according to the conventional method. The addition reaction of the saturated or unsaturated polybasic acid anhydride (c) can be performed according to a substantially same method as the above.

It is required that the obtained ultraviolet curable resin (A) includes 0.3 to 10 mol, and more preferably 0.5 to 8 mol of a polymerizable unsaturated group in 1 kg thereof. In this case, it is possible to provide a permanent film having excellent flexibility and flexural endurance by use of a photo solder resist ink containing the ultraviolet curable resin composition of the present invention. Thus, the photo solder resist ink of the present invention is particularly suitable to manufacture a flexible printed circuit board using a film-like substrate such as polyester or polyimide.

A weight-average molecular weight of the ultraviolet curable resin (A) is not specifically limited. However, it is preferred that the weight-average molecular weight is within a range of 3000 to 400000. In this range, the ultraviolet curable resin composition exhibits excellent sensitivity and resolution.

To stably provide good sensitivity and workability of the ultraviolet curable resin composition of the present invention and good properties of a resist film thereof, it is preferred that a compounding amount of the ultraviolet curable resin (A) is within a range of 10 to 80 wt % with respect to a total amount of the components of the ultraviolet curable resin composition of the present invention except for the organic solvent in the diluent (D). In this range, it is possible to remarkably improve the ultraviolet curability of the ultraviolet curable resin composition and reduce the surface tackiness of a predried film thereof.

As the epoxy compound (B) having at least two epoxy groups in one molecule, for example, an epoxy compound that is hardly soluble in solvent or an epoxy compound that is soluble in solvent can be used. Specifically, it is possible to use phenol novolac-type epoxy resin, cresol novolac-type epoxy resin, bisphenol A-type epoxy resin, bisphenol A-novolac-type epoxy resin, bisphenol F-type epoxy resin, triglycidyl isocyanurate, monoallyl diglycidyl isocyanurate, YX 4000 (manufactured by Yuka Shell Epoxy Kabushiki Kaisha), sorbitol polyglycidyl ether, N-glycidyl-type epoxy resin, alicyclic-type epoxy resin (e.g., "EHPE-3150" manufactured by Daicel Chemical Industries, Ltd.), polyol polyglycidyl ether compound, glycidyl ester compound, N-glycidyl epoxy resin, tris (hydroxyphenyl)methane-based polyfunctional epoxy resin (e.g., "EPPN-502H" manufactured by NIPPON KAYAKU Co., LTD. or "TACTIX-742" and "XD-9053" manufactured by DOW CHEMICAL), hydrogenated bisphenol A-type epoxy resin, dicyclopentadiene-phenol-type epoxy resin, naphthalene-type epoxy resin, or a vinyl polymerization polymer having epoxy group. One of these compounds or a combination thereof can be used as the epoxy compound (B). In addition, these compounds may have a modification by crosslinking. In particular, it is preferred to use triglycidyl isocyanurate, YX 4000, phenol novolac-type epoxy resin, cresol novolac-type epoxy resin, bisphenol A-type epoxy resin, or bisphenol A-novolac-type epoxy resin.

It is preferred that a compounding amount of the epoxy compound (B) is within a range of 0.1 to 50 wt % with respect to the total amount of the components of the ultraviolet curable resin composition of the present invention except for the organic solvent in the diluent (D). In this range, the ultraviolet curable resin composition exhibits excellent thermosetting property, and a remarkably wide developing width.

As the photopolymerization initiator (C), for example, it is possible to use benzoin, an alkyl ether of benzoin such as benzoin methyl ether, benzoin ethyl ether and benzoin isopropyl ether, acetophenone such as acetophenone, 2,2-dimethoxy-2-phenyl acetophenone, 2,2-diethoxy-2-phenyl acetophenone, 1,1-dichloroacetophenone and 1-hydroxy cyclohexyl phenylketone, anthraquinone such as 2-methyl anthraquinone and 2-amyl anthraquinone, thioxanthone such as 2,4-dimethyl thioxanthone, 2,4-diethyl thioxanthone, 2-chlorothioxanthone, 2,4-diisopropyl thioxanthone and 1-chloro-4-propoxy thioxanthone, ketal such as acetophenone dimethylketal and benzyl dimethyl ketal, benzophenone or xanthone such as 3,3-dimethyl-4-methoxy benzophenone, 3,3', 4,4'-tetra-(t-butyl peroxyl carbonyl) benzophenone and 4-benzoyl-4'-methyl diphenyl sulfido, nitrogen containing compound such as 2-methyl-1-[4-(methylthio)phenyl]-2-morpholino-propane-1-on, 2-benzyl-2-dimethylamino-1-(4-morpholinophenyl)-butane-1 and 4,4'-bis-diethyl aminobenzophenone, or 2,4,6-trimethyl benzoyidiphenyl phosphine oxide. These compounds may be used together with a conventional photopolymerization enhancer or sensitizer such as benzoic acid, and tertiary amine, e.g., p-dimethyl aminobenzoic acid ethyl ester, p-dimethyl aminobenzoic acid isoamyl ester, and 2-dimethyl aminoethyl benzoate. One of these compounds or a combination of thereof can be used as the photopolymerization initiator (C).

In addition, as a sensitizer for laser exposure, for example, it is possible to use a coumarin derivative such as 7-dimethylamino-4-methylcoumarin, 4,6-diethyl-7-ethylaminocoumarin, or a metallocene such as carbocyanine dye, xanthene dye, bis($\eta^5$-2,4-cyclopentadiene-1-yl)-bis(2, 6-difluoro-3-(1H-pyrrole-1-yl)-phenyl) titanium. In this case, it is possible to allow the ultraviolet curable resin composition to exhibit near-infrared curability or visual-light curability.

To achieve good balance between photocurability and properties of the solder resist, it is preferred that a compounding amount of the photopolymerization initiator (C) is within a range of 0.1 to 30 wt % with respect to the total amount of the components of the ultraviolet curable resin composition of the present invention except for the organic solvent in the diluent (D). In this range, the ultraviolet curable resin composition exhibits excellent ultraviolet curability as well as remarkably improved heat resistance and electrical corrosion resistance of a cured film thereof.

As the diluent (D), one of an ethylenically unsaturated photopolymerizable monomer (D-1), an organic solvent (D-2) or a mixture thereof can be used. As the ethylenically unsaturated monomer (D-1), for example, it is possible to use 2-hydroxyethyl (meth)acrylate, 2-hydroxypropyl (meth)acrylate, N-vinyl pyrrolidone, (meth)acryloyl morpholine, methoxy tetraethylene glycol (meth)acrylate, methoxy polyethylene glycol (meth)acrylate, polyethylene glycol di(meth)acrylate, N,N-dimethyl (meth)acrylamide, N-methylol (meth)acrylamide, N,N-dimethyl aminopropyl (meth)acrylamide, N,N-dimethyl aminoethyl (meth) acrylate, N,N-dimethyl aminopropyl (meth)acrylate, melamine (meth)acrylate, diethylene glycol di(meth) acrylate, triethylene glycol di(meth)acrylate, propylene glycol di(meth)acrylate, tripropylene glycol di(meth)acrylate, phenoxyethyl (meth)acrylate, tetrahydrofurfuryl (meth) acrylate, cyclohexyl (meth)acrylate, trimethylolpropane di(meth)acrylate, trimethylolpropane tri(meth)acrylate, pentaerythritol tri(meth)acrylate, pentaerythritol tetra(meth) acrylate, dipentaerythritol penta(meth)acrylate, dipentaerythritol hexa(meth)acrylate, isobonyl (meth)acrylate, cyclopentanyl mono(meth)acrylate, cyclopentenyl mono (meth)acrylate, trimethylolpropane EO-denatured triacrylate, cyclopentanyl di(meth)acrylate, cyclopentenyl di(meth)acrylate, mono-, di-, tri- or more polyester of polybasic acid and hydroxyalkyl (meth)acrylate, or a (meth) acrylate monomer such as polyester (meth)acrylate and urethane (meth)acrylate. One of these compounds or a combination thereof can be used.

As the organic solvent (D-2), for example, it is possible to use a straight-chained, branch-chained, secondary or multiple alcohol such as ethanol, propyl alcohol, isopropyl alcohol, butyl alcohol, isobutyl alcohol, 2-butyl alcohol, hexanol, and ethylene glycol, ketone such as methyl ethyl ketone and cyclohexanone, aromatic hydrocarbon such as toluene and xylene, an oil aromatic mixture solvent such as "SWASOL SERIES" (manufactured by Maruzen Petrochemical Co., Ltd.), "SOLVESSO SERIES" (manufactured by EXXON CHEMICAL COMPANY), cellosolve such as cellosolve and butyl cellosolve, carbitol such as carbitol and butyl carbitol, propylene glycol alkyl ether such as propylene glycol methyl ether, polypropylene glycol alkyl ether such as dipropylene glycol methyl ether, acetic ester such as ethyl acetate, butyl acetate, cellosolve acetate, butyl cellosolve acetate, butyl carbitol acetate and propylene glycol monomethyl ether acetate, or dialkyl glycol ether. One of these compounds or a combination of thereof can be used as the organic solvent.

The ethylenically unsaturated photopolymerizable monomer (D-1) used as the diluent (D) dilutes the ultraviolet curable resin (A) to provide easiness of applying the resin composition and adjusts the acid value of the resin composition to obtain suitable photocurability. In addition, the organic solvent (D-2) used as the diluent (D) dissolves and dilutes the ultraviolet curable resin composition (A), so that the liquid resin composition can be easily applied, and then dried to obtain a film.

When the diluent (D) contains the ethylenically unsaturated photopolymerizable monomer (D-1), it is preferred that the component (D-1) includes 3 to 12 mol of a polymerizable unsaturated group in 1 kg thereof. In this range, the photo solder resist ink including the ultraviolet curable resin composition of the present invention can provide a permanent film having remarkably improved flexibility and flexural endurance. As a result, the photo solder resist ink of the present invention becomes suitable to manufacture a flexible printed circuit board using a film-like substrate such as polyester or polyimide.

By the way, the ultraviolet curable resin composition of the present invention does not necessarily require the ethylenically unsaturated photopolymerizable monomer (D-1) as the diluent (D). However, when using the ethylenically unsaturated photopolymerizable monomer (D-1) in the diluent (D), it is preferred that the compounding amount is 50 wt % or less with respect to the total amount of components of the ultraviolet curable resin composition of the present invention except for the organic solvent in the diluent (D). When the compounding amount is more than 50 wt %, there is a fear of increasing the surface tackiness of the predried film. Therefore, when a negative photomask having a required pattern is directly put on the predried film, and then exposure is performed, a contamination of the photomask may happen.

On the other hand, the organic solvent (D-2) used as the diluent (D) is an essential component to obtain the ultraviolet curable resin composition developable with a diluted alkali aqueous solution. It is required that the organic solvent can be rapidly evaporated from the resin composition by predrying without being left in the predried film. It is preferred that a compounding amount of the organic solvent is 5 wt % or more with respect to the total amount of components of the ultraviolet curable resin composition of the present invention. When the compounding amount is less than 5 wt %, there is a fear that it becomes difficult to uniformly apply the resin composition. An upper limit of the compounding amount of the organic solvent is not specifically limited because a suitable compounding amount of the organic solvent is determined according to an applying method used.

Besides the above-explained components, the ultraviolet curable resin composition of the present invention may contain a blocked isocyanate, a thermosetting component such as amino resin, ultraviolet curable epoxy (meth)acrylate, for example, a first compound obtained by adding (meth)acrylic acid to a bisphenol A-type, phenol novolac-type, cresol novolac-type or an alicyclic epoxy resin, a second compound obtained by adding a saturated or unsaturated polybasic acid anhydride such maleic anhydride, succinic anhydride, itaconic anhydride, phthalic anhydride and tetrahydrophthalic anhydride to the first compound, an ultraviolet curable polymer obtained by reacting hydroxyalkyl (meth)acrylate, (meth)acrylate having epoxy group with a copolymer of maleic anhydride and the other ethylenically unsaturated monomer, a copolymer of an ethylenically unsaturated compound such as styrene-(meth)acrylic acid-(meth)acrylic acid ester copolymer, an ultraviolet curable polymer obtained by reacting an ethylenically unsaturated monomer having epoxy group with the copolymer, an ultraviolet curable polymer obtained by adding (meth)acrylic acid to a vinyl copolymer containing the ethylenically unsaturated monomer having epoxy group as a monomer unit, or a high molecular compound such as styrene-maleic resin, diallyl phthalate resin, phenoxy resin, melamine resin, urethane resin, and a fluorine containing resin.

If necessary, the ultraviolet curable resin composition of the present invention may contain an additive such as an epoxy resin curing agent, curing enhancer, filler, coloring agent, leveling agent, adhesion supplying agent, thixotropic agent, polymerization inhibitor, antihalation agent, flame retardant, defoamer, dispersion stabilizing agent, high molecular dispersing agent and an anti-oxidant.

The ultraviolet curable resin composition of the present invention can be obtained by kneading the above-explained components and the additives with a conventional kneading means such as three rolls, ball mill and sand mill. For example, a first mixture is prepared by mixing a part of components (A) to (D), for example, a part of the component (D) with the component (B), and on the other hand, a second mixture is prepared by mixing the components (A) and (C) with the rest of the component (D). In this case, the first mixture may be mixed with the second mixture according to the compounding amounts described above at the time of using the resin composition of the present invention.

Directions for use of the ultraviolet curable resin composition of the present invention are not specifically limited. For example, the ultraviolet curable resin composition can be used as the photo solder resist ink that is preferable to manufacture a printed circuit board having a high-density, fine conductive pattern. By use of this photo solder resist ink, a resist pattern can be formed on the printed circuit board or a substrate. In this case, by curing the pattern of the photo solder resist ink formed on the printed circuit board or the substrate, a resist pattern of a cured film thereof can be obtained.

As an example, the resist pattern can be formed on the substrate according to the following method. First, the photo solder resist ink is applied on the substrate by use of dipping, spraying, spin coating, roll coating, curtain coating, screen printing, and so on. Then, to volatilize the organic solvent of the diluent from the applied film, predrying is performed at a temperature of 60 to 120° C., to thereby obtain a predried film.

Next, a negative mask having a required pattern is directly or indirectly put on the predried film, and ultraviolet is radiated to the predried film through the mask by use of a chemical lamp, low-pressure mercury lamp, intermediate-pressure mercury lamp, high-pressure mercury lamp, ultra-high-pressure mercury lamp, xenon lamp, metalhalide lamp, and so on. Then, developing is performed to obtain a pattern. In addition, a heat treatment is performed at a temperature of 120 to 180° C. for 30 to 90 minutes to cure the epoxy compound, to obtain a resist pattern of a cured film having excellent film strength, hardness and chemical resistance.

This cured film can be used as a permanent mask. That is, by using a printed circuit board as a substrate, which is obtained by forming a conductive pattern on an insulating layer of an insulting material such as resins or ceramics by a conventional printing technique, and forming a permanent film on this substrate, it is possible to provide the printed circuit board with the permanent film having excellent flexibility and solder heat resistance.

In addition, since the photo solder resist ink including the ultraviolet curable resin composition of the present invention has an advantage that the cured film exhibits excellent flexibility and solder heat resistance, it is suitable to form the permanent film for a flexible printed circuit board. In this case, the permanent film can be formed on a wiring board, which is obtained by forming a conductive pattern on a substrate of a plastic film having flexibility and electrical insulation such as polyester or polyimide according to the conventional printing technique.

In addition, it is possible to provide a dry film resist by forming a film of the ultraviolet curable resin composition or the photo solder resist ink of the present invention on a support. In this case, it is preferred that the film thickness is within a range of 10 to 100 μm, and a film having a thickness of 5 to 100 μm such as polyethylene terephthalate is used the support. The dry film of the ultraviolet curable resin composition or the photo solder resist ink can be obtained by applying it on the film that is the support, and drying the applied film.

As an alkaline solution used in the developing step, for example, it is possible to use an aqueous solution of sodium carbonate, potassium carbonate, ammonium carbonate, sodium hydrogencarbonate, potassium hydrogencarbonate, ammonium hydrogencarbonate, sodium hydroxide, potassium hydroxide, ammonium hydroxide, or lithium hydroxide. Besides these alkaline solutions, it is possible to use an organic amine such as monoethanol amine, diethanol amine, triethanol amine, monoisopropanol amine, diisopropanol amine, or triisopropanol amine. One of these compounds or a combination thereof can be used. As a solvent for the alkaline solution, it is possible to use water, or a mixture of water and an organic solvent having hydrophilicity, e.g., a lower alcohol.

The ultraviolet curable resin composition of the present invention is particularly suitable to use for the photo solder resist ink. However, the application field is not limited to the photo solder resist ink. For example, the resin composition can be used to form a protective film for color filter. In addition, the resin composition may be used as a composition for preparing color filter pixels by selecting a suitable coloring agent, for example, an organic pigment such as azo lake pigment, insoluble azo pigment and phthalocyanine pigment, inorganic pigment such as iron blue, iron oxide and cobalt, solvent dye, basic dye, disperse dye, or the like.

EXAMPLES

Example 1

The present invention is explained below according to Examples. However, the present invention is not limited to them. Unless otherwise specified, "parts" and "%" used below is based on weight.

Synthesis Example 1

A mixture of 70 parts of glycidyl methacrylate, 10 parts of "NK Ester 9G" [manufactured by SHINNAKAMURA CHEMICAL INDUSTRIAL CO., LTD., polypropylene glycol #400 dimethacrylate (n=9), molecular weight=536], 20 parts of methyl methacrylate, 100 parts of carbitol acetate, 0.2 parts of laurylmercaptan, and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours, 45 parts of tetrahydrophthalic anhydride and 79 parts of carbitol acetate were added to the mixture. The obtained mixture was kept at 100° C. for 3 hours to obtain a 50% ultraviolet curable resin solution (A-1). The ultraviolet curable resin (A) of this ultraviolet curable resin solution (A-1) contains 2.9 mol of a polymerizable unsaturated group in 1 kg thereof.

Synthesis Example 2

A mixture of 70 parts of glycidyl methacrylate, 10 parts of "NK Ester 9PG" [manufactured by SHINNAKAMURA CHEMICAL INDUSTRIAL CO., LTD., polypropylene glycol #400 dimethacrylate (n=7), molecular weight=536], 15 parts of methyl methacrylate, 5 parts of t-butyl methacrylate, 100 parts of carbitol acetate and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours, 38 parts of tetrahydrophthalic anhydride and 72 parts of carbitol acetate were added to the mixture. The obtained mixture was kept at 100° C. for 3 hours to obtain a 50% ultraviolet curable resin solution (A-2). The ultraviolet curable resin (A) of this ultraviolet curable resin solution (A-2) contains 3.0 mol of a polymerizable unsaturated group in 1 kg thereof.

Synthesis Example 3

A mixture of 70 parts of glycidyl methacrylate, 5 parts of "NK Ester A-BPE-4" [manufactured by SHINNAKAMURA CHEMICAL INDUSTRIAL CO., LTD., 2,2-bis[4-(acryloxy-diethoxy)phenyl]propane, molecular weight=512], 15 parts of methyl methacrylate, 10 parts of cyclohexyl maleimide, 100 parts of carbitol acetate, 0.1 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours, 38 parts of tetrahydrophthalic anhydride and 72 parts of carbitol acetate were added to the mixture. The obtained mixture was kept at 100° C. for 3 hours to obtain a 50% ultraviolet curable resin solution (A-3). The ultraviolet curable resin (A) of this ultraviolet curable resin solution (A-3) contains 3.0 mol of a polymerizable unsaturated group in 1 kg thereof.

Synthesis Example 4

A mixture of 70 parts of glycidyl methacrylate, 14 parts of "Blemmer 43 DB-40B" [manufactured by NOF Corp., bisphenol-A polyethylene glycol polypropylene glycol adduct dimethacrylate, molecular weight=approximately 1180], 6 parts of methyl methacrylate, 10 parts of t-butyl methacrylate, 100 parts of carbitol acetate, 0.3 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 105° C. for 24 hours, 38 parts of tetrahydrophthalic anhydride and 72 parts of carbitol acetate were added to the mixture. The obtained mixture was kept at 100° C. for 3 hours to obtain a 50% ultraviolet curable resin solution (A-4). The ultraviolet curable resin (A) of this ultraviolet curable resin solution (A-4) contains 3.0 mol of a polymerizable unsaturated group in 1 kg thereof.

Synthesis Example 5

A mixture of 70 parts of glycidyl methacrylate, 10 parts of "NK Ester TMPT" [manufactured by SHINNAKAMURA CHEMICAL INDUSTRIAL CO., LTD., trimethylolpropane trimethacrylate, molecular weight=338], 15 parts of methyl methacrylate, 5 parts of t-butyl methacrylate, 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 105° C. for 24 hours, 38 parts of tetrahydrophthalic anhydride and 72 parts of carbitol acetate were added to the mixture. The obtained mixture was kept at 100° C. for 3 hours to obtain a 50% ultraviolet curable resin solution (A-5). The ultraviolet curable resin (A) of this ultraviolet curable resin solution (A-5) contains 3.3 mol of a polymerizable unsaturated group in 1 kg thereof.

Synthesis Example 6

A mixture of 80 parts of glycidyl methacrylate, 20 parts of "NK Ester 9PG" [manufactured by SHINNAKAMURA CHEMICAL INDUSTRIAL CO., LTD., polypropylene glycol #400 dimethacrylate (n=7), molecular weight=536], 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 42.6 parts of acrylic acid and 0.2 parts of dimethylbenzylamine were added to the 50% copolymer solution. After a resultant mixture was kept at 100° C. for 24 hours, 45 parts of tetrahydrophthalic anhydride and 84 parts of carbitol acetate were added to the mixture. The obtained mixture was kept at 100° C. for 3 hours to obtain a 50% ultraviolet curable resin solution (A-6). The ultraviolet curable resin (A) of this ultraviolet curable resin solution (A-6) contains 3.4 mol of a polymerizable unsaturated group in 1 kg thereof.

Synthesis Example 7

A mixture of 70 parts of glycidyl methacrylate, 1 parts of "NK Ester 9PG" [manufactured by SHINNAKAMURA CHEMICAL INDUSTRIAL CO., LTD., polypropylene glycol #400 dimethacrylate (n=7), molecular weight=536], 15 parts of methyl methacrylate, 14 parts of t-butyl methacrylate, 100 parts of carbitol acetate and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours, 38 parts of tetrahydrophthalic anhydride and 72 parts of carbitol acetate were added to the mixture. The obtained mixture was kept at 100° C. for 3 hours to obtain a 50% ultraviolet curable resin solution (A-7). The ultraviolet curable resin (A) of this ultraviolet curable resin solution (A-7) contains 2.9 mol of a polymerizable unsaturated group in 1 kg thereof.

Synthesis Example 8

A mixture of 70 parts of glycidyl methacrylate, 20 parts of methyl methacrylate, 10 parts of t-butyl methacrylate, 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 100° C. for 24 hours, 45 parts of tetrahydrophthalic anhydride and 79 parts of carbitol acetate were added to the mixture. The obtained mixture was kept at 100° C. for 3 hours to obtain a 50% ultraviolet curable resin solution (A-8). The ultraviolet curable resin (A) of this ultraviolet curable resin solution (A-8) contains 2.8 mol of a polymerizable unsaturated group in 1 kg thereof.

Synthesis Example 9

A mixture of 70 parts of glycidyl methacrylate, 20 parts of methyl methacrylate, 10 parts of cyclohexyl maleimide, 100 parts of carbitol acetate, 0.2 parts of laurylmercaptan and 3 parts of azobisisobutyronitrile was polymerized at a temperature of 80° C. for 5 hours under a nitrogen gas flow in a four-mouth flask, which is provided with a reflux condenser, thermometer, glass tube for nitrogen substitution and an agitator, while being agitated. As a result of this polymerization, a 50% copolymer solution was obtained.

Next, 0.05 parts of hydroquinone, 37 parts of acrylic acid and 0.2 parts of dimethylbenzylamine were added to the 50% copolymer solution. After a resultant mixture was kept at 105° C. for 24 hours, 38 parts of tetrahydrophthalic anhydride and 72 parts of carbitol acetate were added to the mixture. The obtained mixture was kept at 100° C. for 3 hours to obtain a 50% ultraviolet curable resin solution (A-9). The ultraviolet curable resin (A) of this ultraviolet curable resin solution (A-9) contains 2.9 mol of a polymerizable unsaturated group in 1 kg thereof.

Synthesis Example 10

214 parts of "EPICLON N-680" (manufactured by DAINIPPON INK AND CHEMICALS INCORPORATED, cresol-novolac epoxy resin, Epoxy Equivalents: 214) was dissolved in 60 parts of carbitol acetate, while being heated. Next, 74 parts of acrylic acid, 0.1 parts of hydroquinone and 0.7 parts of benzyldimethylamine were added to a resultant mixture, while the mixture being agitated, and then kept at a temperature of 90 to 100° C. for 24 hours. In addition, 95 parts of carbitol acetate was added to the obtained reaction solution, and agitated and cooled to obtain an epoxy acrylate solution. Next, 76 parts of tetrahydrophthalic anhydride and 87 parts of carbitol acetate were added to the epoxy acrylate solution, and kept at 100° C. for 3 hours to obtain a 60% ultraviolet curable resin solution (E-1).

Examples 1 to 9 and Comparative Example 1

A mixture of the ultraviolet curable resin solutions (A-1) to (A-9) and (E-1) obtained in the above-described Synthesis Examples, and other components was prepared according to compounding amounts listed in Table 1, and then kneaded by use of three rolls to obtain liquid photo solder resist inks developable with a diluted alkali aqueous solution of Examples 1 to 9 and Comparative Example 1.

In Table 1, "NK Ester A-TMPT-3EO" is trimethylolpropane EO-denatured triacrylate [manufactured by SHINNAKAMURA CHEMICAL INDUSTRIAL CO., LTD., molecular weight=428]. "NK Ester 14G" is triethyleneglycol #600 dimethacrylate [manufactured by SHINNAKAMURA CHEMICAL INDUSTRIAL CO., LTD., molecular weight=736]. "EPICLON N-695" is a cresol novolac-type epoxy resin (manufactured by DAINIPPON INK AND CHEMICALS INCORPORATED). "YX 4000" is an epoxy compound (manufactured by Yuka Shell Epoxy Kabushiki Kaisha, epoxy equivalent: 195). "TEPIC-S" is triglycidyl isocyanurate (manufactured by NISSAN CHEMICAL INDUSTRIES, epoxy equivalent : 100). "IRGACURE 907" is a photopolymerization initiator (manufactured by CIBA-GEIGY CORPORATION, (2-methyl-1-[4-methylthio (phenyl)]-2-morpholinopropane-1-on)). "KAYACURE DETX-S" is a photopolymerization initiator (manufactured by Nippon Kayaku Co., Ltd., 2,4-diethyl thioxanthone). "MODAFLOW" is a leveling agent (manufactured by MONSANTO COMPANY). "SWASOL 1500" is an oil aromatic mixture solvent (manufactured by Maruzen Petrochemical Co., Ltd.).

In addition, dipentaerythritol hexaacrylate, "NK Ester A-TMPT-3EO" and "NK Ester 14G", which were used as the ethylenically unsaturated photopolymerizable monomer (D-1), respectively contain 10.3 mol, 7.0 mol and 2.7 mol of the polymerizable unsaturated group in 1 kg thereof.

Properties of each of the resist inks and a printed circuit board with a solder resist formed by use of the resist ink were evaluated according to the following test methods. Results are shown in Table 2.

TABLE 1

|  | Examples | | | | | | | | | Comparative Example |
|---|---|---|---|---|---|---|---|---|---|---|
|  | 1 | 2 | 3 | 4 | 5 | 6 | 7 | 8 | 9 | 1 |
| Ultraviolet curable resin solution (A-1) | 50 | | | | | | | | | |
| Ultraviolet curable resin solution (A-2) | | 50 | | | | | | | | |
| Ultraviolet curable resin solution (A-3) | | | 50 | | | | | | | |
| Ultraviolet curable resin solution (A-4) | | | | 50 | | | | | | |
| Ultraviolet curable resin solution (A-5) | | | | | 50 | | | | | |
| Ultraviolet curable resin solution (A-6) | | | | | | 50 | | | | |
| Ultraviolet curable resin solution (A-7) | | | | | | | 50 | | | |
| Ultraviolet curable resin solution (A-8) | | | | | | | | 50 | | |
| Ultraviolet curable resin solution (A-9) | | | | | | | | | 50 | |
| Ultraviolet curable resin solution (E-1) | | | | | | | | | | 50 |
| Dipentaerythritol hexaacrylate | 5 | | 2 | 2 | 1 | 1 | | 2 | | 3 |
| NK EsterA-TMPT-3EO | | 5 | 3 | 3 | 4 | 4 | | 3 | | 2 |
| NK Ester 14G | | | | | | | 5 | | 5 | |
| EPICLON N-695 | 10 | 10 | | 10 | | | 10 | 10 | | |
| YX4000 | | | | | 10 | | | | | |
| TEPIC-S | | | 10 | | | 10 | | | 10 | 10 |
| IRGACURE 907 | 4 | 4 | 4 | 4 | 4 | 4 | 4 | 4 | 4 | 4 |
| KAYACURE DETX-S | 0.5 | 0.5 | 0.5 | 0.5 | 0.5 | 0.5 | 0.5 | 0.5 | 0.5 | 0.5 |
| MODAFLOW | 1 | 1 | 1 | 1 | 1 | 1 | 1 | 1 | 1 | 1 |
| Silica (average grain size: 1 μm) | 10 | 10 | 10 | 10 | 10 | 10 | 10 | 10 | 10 | 10 |
| Barium sulfate | 17 | 17 | 17 | 17 | 17 | 17 | 17 | 17 | 17 | 17 |
| Melamine | 1 | 1 | 1 | 1 | 1 | 1 | 1 | 1 | 1 | 1 |
| Phthalocyanine green | 0.5 | 0.5 | 0.5 | 0.5 | 0.5 | 0.5 | 0.5 | 0.5 | 0.5 | 0.5 |
| SWASOL 1500 | 1 | 1 | 1 | 1 | 1 | 1 | 1 | 1 | 1 | 1 |

TABLE 2

| Test item | | | Examples | | | | | | | | | Comparative Example |
|---|---|---|---|---|---|---|---|---|---|---|---|---|
|  |  |  | 1 | 2 | 3 | 4 | 5 | 6 | 7 | 8 | 9 | 1 |
| Predrying property/ Drying temperature (80° C.) | Surface tackiness | drying time: 10 min | ◯ | ◯ | ◯ | ◯ | ◯ | ◯ | ◯ | ◯ | ◯ | Δ |
| | | drying time: 20 min | ◯ | ◯ | ◯ | ◯ | ◯ | ◯ | ◯ | ◯ | ◯ | ◯ |
| | | drying time: 30 min | ◯ | ◯ | ◯ | ◯ | ◯ | ◯ | ◯ | ◯ | ◯ | ◯ |
| | Predrying time acceptable range (Developing width) | drying time: 10 min | ◯ | ◯ | ◯ | ◯ | ◯ | ◯ | ◯ | ◯ | ◯ | ◯ |
| | | drying time: 20 min | ◯ | ◯ | ◯ | ◯ | ◯ | ◯ | ◯ | ◯ | ◯ | ◯ |
| | | drying time: 30 min | ◯ | ◯ | ◯ | ◯ | ◯ | ◯ | ◯ | ◯ | ◯ | ◯ |
| | | drying time: 40 min | ◯ | ◯ | ◯ | ◯ | ◯ | ◯ | ◯ | ◯ | ◯ | ◯ |
| | | drying time: 50 min | ◯ | ◯ | ◯ | ◯ | ◯ | ◯ | ◯ | ◯ | ◯ | ◯ |
| | | drying time: 60 min | ◯ | ◯ | ◯ | ◯ | ◯ | ◯ | ◯ | ◯ | ◯ | ◯ |
| | | drying time: 70 min | ◯ | ◯ | ◯ | ◯ | ◯ | ◯ | ◯ | ◯ | ◯ | Δ |

TABLE 2-continued

|  | Test item | | | Examples | | | | | | | | | Comparative Example |
|---|---|---|---|---|---|---|---|---|---|---|---|---|---|
|  |  | | | 1 | 2 | 3 | 4 | 5 | 6 | 7 | 8 | 9 | 1 |
|  |  | drying time: 80 min | | ○ | ○ | ○ | ○ | ○ | ○ | ○ | Δ | Δ | Δ |
|  |  | drying time: 90 min | | ○ | ○ | ○ | Δ | Δ | ○ | ○ | Δ | Δ | X |
| Remaining | Exposure amount: 50 mJ/cm² | | | 5 | 5 | 5 | 5 | 5 | 5 | 5 | 5 | 5 | 5 |
| step number | Exposure amount: 150 mJ/cm² | | | 8 | 8 | 8 | 8 | 8 | 8 | 8 | 8 | 8 | 8 |
| Properties of | Resolution | | | ○ | ○ | ○ | ○ | ○ | ○ | ○ | ○ | ○ | ○ |
| test piece under | Adhesion between solder resist and substrate | | | ○ | ○ | ○ | ○ | ○ | ○ | ○ | ○ | ○ | ○ |
| optimum exposure | Solder heat resistance | Soldering (once) | Discoloration to white | ⊚ | ⊚ | ⊚ | ⊚ | ⊚ | ⊚ | ⊚ | ○ | ○ | ○ |
|  |  |  | Adhesion | ⊚ | ⊚ | ⊚ | ⊚ | ⊚ | ⊚ | ⊚ | ○ | ○ | ○ |
|  |  | Soldering (5 times) | Discoloration to white | ○ | ○ | ○ | ○ | ○ | ○ | ○ | ○ | Δ | Δ |
|  |  |  | Adhesion | ○ | ○ | ○ | ○ | ○ | ○ | ○ | ○ | Δ | X |
|  | Pencil hardness | | | 6H | 6H | 7H | 6H | 6H | 6H | 6H | 6H | 6H | 5H |
|  | Resistance to gold plating | | | ○ | ○ | ○ | ○ | ○ | ○ | ○ | ○ | ○ | Δ |
|  | Electrical corrosion resistance | | | ○ | ○ | ○ | ○ | ○ | ○ | ○ | ○ | ○ | Δ |
|  | Flexibility | | | ○ | ○ | ○ | ○ | ○ | ○ | ○ | Δ | Δ | X |
|  | Flexural endurance | | | ○ | ○ | ○ | ○ | ○ | ○ | Δ | Δ | Δ | X |

Surface Tackiness

The photo solder resist ink was applied on a surface of a copper clad polyimide film substrate (copper thickness/12 μm: polyimide film thickness/25 μm) by screen printing. Then, predrying was performed at 80° C. to volatilize the solvent from the applied resist ink for three different drying times, i.e., 10, 20 and 30 minutes. As a result, three kinds of predried films having the thickness of about 20 μm were obtained with respect to each of the photo solder resist inks.

Subsequently, by use of "ORC HMW680GW" (a low-pressure adhesive type double-sided exposing machine manufactured by ORC Manufacturing Co., Ltd.), a mask with a required pattern was directly put on each of the predried film, and adhered thereto under a reduced pressure. After 150 mJ/cm² of ultraviolet light was radiated through the mask, the mask was removed from the predried film, and the surface tackiness of the predried film was evaluated according to the following criteria.

X: It was difficult to remove the mask from the predried film. When the mask was forcedly removed from the predried film, a considerable damage of the mask occurred, so that the mask could not be used again.

Δ: After the mask was removed from the predried film, a sign of the mask remained on the predried film.

○: The mask was easily removed from the predried film without leaving a sign of the mask thereon.

Developing Width (Predrying Time Acceptable Range)

The resist ink was applied on a surface of a copper clad laminate, which is composed of a glass epoxy substrate and a copper foil having the thickness of 35 μm, by screen printing. Then, predrying was performed at 80° C. to volatilize the solvent from the applied resist ink for nine different drying times, i.e., 10, 20, 30, 40, 50, 60, 70, 80 and 90 minutes. As a result, nine kinds of predried films having the thickness of about 20 μm were obtained with respect to each of the resist inks.

Subsequently, a mask having a required pattern was directly put on the predried film, and adhered thereto. After an optimum amount of ultraviolet light was radiated through the mask, developing was performed by use of a 1% sodium carbonate aqueous solution as a developer. The developing property and the formed pattern were evaluated according to the following criteria.

X: It was difficult to remove unexposed portions of the predried film by developing. Therefore, it was impossible to form the pattern.

Δ: It took an extended time period to develop unexposed portions of the predried film. In addition, it was impossible to form a fine pattern.

○: Unexposed portions of the predried film was easily developed to obtain sharp patterns.

Remaining Step Number

The photo solder resist ink was applied on a surface of a copper clad polyimide film substrate (copper thickness/ 12 μm: polyimide film thickness/25 μm) by screen printing. Predrying was performed at 80° C. for 20 minutes to volatilize the solvent from the predried film. As a result, two test pieces each having the predried film with the thickness of 20 μm were obtained with respect to each of the resist inks.

Subsequently, by use of "ORC HMW680GW" (a low-pressure adhesive type double-sided exposing machine manufactured by ORC Manufacturing Co., Ltd.), "STEP TABLET PHOTEC 21 steps" (a mask for exposure test manufactured by Hitachi Chemical Co., Ltd.) was directly put on the predried film, and adhered thereto under a reduced pressure. 50 mJ/cm² of ultraviolet light was radiated to one of the test pieces through the mask. 150 mJ/cm² of ultraviolet light was radiated to the other one of the test pieces through the mask. Next, developing was performed by use of a 1% sodium carbonate aqueous solution as a developer. After the developing step, the remaining step number was counted to evaluate exposure sensitivity.

Performance Evaluation of Printed circuit board

To evaluate a printed circuit board manufactured by use of each of the photo solder resist inks, test pieces were prepared according to the following steps (1) to (5).

(1)<Applying Step>

The photo solder resist ink was applied by screen printing on a surface of a printed circuit board, which was previously manufactured by preparing a copper clad polyimide film substrate (copper thickness/12 μm: polyimide film thickness/25 μm), and forming a required pattern thereon by etching, to thereby obtain a resist ink layer thereon.

(2)<Predrying Step>

After the applying step, predrying was performed at 80° C. for 20 minutes to volatilize the solvent from the applied resist ink layer, to thereby obtain a predried film having the thickness of 20 μm.

(3)<Exposing Step>

Subsequently, the predried film was selectively exposed by putting a mask having a required pattern directly on the predried film, and radiating an optimum amount of ultraviolet light through the mask.

(4)<Developing Step>

After the exposing step, unexposed portions of the predried film were developed and removed by use of a 1% sodium carbonate aqueous solution as a developer, to thereby obtain a pattern of the predried film cured by the exposure on the printed circuit board.

(5)<Post-baking Step>

After the developing step, the printed circuit board having the predried film was heated at 150° C. for 30 minutes to cure the predried film. As a result, the test piece having a resist of the cured film was obtained.

The following evaluations were carried out with respect to the obtained test pieces.

Resolution

By use of a mask pattern having a plurality of slits, which are concentrically formed such that a slit width and a distance between adjacent slits are respectively 40 μm, the pattern of the predried film was formed.

The resolution of the formed pattern was evaluated according to the following criteria.

X: It was impossible to form the pattern.

Δ: The pattern was obtained by somehow, but some defects were observed.

o: The pattern was accurately formed.

Solder Heat Resistance

"LONCO 3355-11" (A water-soluble flux manufactured by London Chemical Co., Ltd.) was applied as a flux on the test pieces. Next, one of the test pieces was dipped once in a molten solder bath kept at 260° C. for 15 seconds and washed by water. With respect to the other one of the test pieces, this procedure was repeated five times. Subsequently, a degree of discoloration to white was checked according to the following evaluation criteria. In addition, a crosscut test was performed according to JIS (Japan Industrial Standard) D 0202 by use of a cellophane adhesive tape.

X: Discoloration to white considerably occurred.

Δ: Discoloration to white occurred.

o: Extremely slight discoloration to white occurred.

⊙: There was no discoloration to white.

The adhesion was evaluated according to the following criteria.

X: Peeling or swelling of the resist occurred before the crosscut test.

Δ: Peeling of the resist was partially caused at cross-cut portions by the crosscut test.

o: There was no peeling of the resist.

Pencil Hardness

A pencil hardness of the resist was measured according to JIS K 5400.

Resistance to Gold Plating

Plating was performed on the test piece by use of an electroless nickel plating bath and an electroless gold plating bath. Then, adhesion of the plated film was checked according to the following criteria to evaluate the resistance to gold plating.

X: Peeling of the plated film occurred before an adhesive tape was removed from the plated film.

Δ: There was no change of appearance of the plated film. However, peeling was partially caused when the adhesive tape was removed from the plated film.

o: There was no change.

Electrical Corrosion Resistance

In place of the test piece, a printed circuit board for evaluation was prepared by use of a spit-type electrode B of IPC B-25 under the above-explained conditions. After a bias voltage of DC 100 V was loaded to the spit-type electrode for 500 hours at the temperature of 40° C. and the humidity of 90% R.H., the occurrence of migration was checked. The electrical corrosion resistance was evaluated according to the following criteria.

X: The occurrence of migration was confirmed.

Δ: A slight migration was confirmed.

o: There was no migration.

Flexibility

An evaluation test for flexibility was carried out according to JIS K5400. A diameter of a rod that is the test piece is 2 mm. The occurrence of cracks was checked.

Flexural Endurance

Flexural endurance was evaluated by bending a test substrate into a 180° angle, and observing the bent portion.

o: No problem

Δ: Peeling did not occur at the bent portion. However, a discoloration to white occurred.

X: Some cracks appeared at the bent portion. Peeling of the cured film occurred.

As clearly understood from Tables 1 and 2, Examples 1 to 9 provides improved developing width, solder heat resistance, excellent flexibility and flexural endurance, as compared with Comparative Example 1. In addition, Examples 1 to 7 each using the ethylenically unsaturated monomer component including the compound (ii) at the time of preparing the ultraviolet curable resin exhibit particularly improved solder heat resistance and flexibility.

INDUSTRIAL APPLICABILITY

As described above, according to the present invention, it is possible to provide the ultraviolet curable resin composition having the capability of forming a cured film with excellent flexibility and solder heat resistance. The photo solder resist ink including this resin composition is particularly suitable to form a permanent film having good flexibility and solder heat resistance on a flexible printed circuit board, of which demand is growing in recent years.

What is claimed is:

1. An ultraviolet curable resin composition comprising:

(A) an ultraviolet curable resin obtained by reacting an epoxy group containing polymer (a), which is prepared by polymerizing an ethylenically unsaturated monomer component including an ethylenically unsaturated monomer (i) having an epoxy group and a compound (ii) having at least two ethylenically unsaturated groups in one molecule, with an ethylenically unsaturated monomer (b) having a carboxyl group, and then reacting a resultant intermediate product with a saturated or unsaturated polybasic acid anhydride (c), said ultraviolet curable resin including 0.3 to 10 mol of a polymerizable unsaturated group in 1 kg thereof;

(B) an epoxy compound having at least two epoxy groups in molecule;

(C) a photopolymerization initiator; and (D) a diluent.

2. The ultraviolet curable resin composition as set forth in claim 1, wherein the ethylenically unsaturated monomer component includes an ethylenically unsaturated monomer (iii) copolymerizable with the ethylenically unsaturated monomer (i).

3. The ultraviolet curable resin composition as set forth in claim 1, wherein a content of the compound (ii) having at least two ethylenically unsaturated groups in one molecule is within a range of 0.1 to 10 mol % with respect to a total amount of the ethylenically unsaturated monomer component used to prepare the epoxy group containing polymer (a).

4. The ultraviolet curable resin composition as set forth in claim 3, wherein the ethylenically unsaturated monomer component includes an ethylenically unsaturated monomer (iii) copolymerizable with the ethylenically unsaturated monomer (i) and the compound (ii).

5. The ultraviolet curable resin composition as set froth in claim 3, wherein the compound (ii) includes di(meth)acrylate.

6. The ultraviolet curable resin composition as set forth in claim 3, wherein the compound (ii) is di(meth)acrylate having at least one oxyalkylene unit.

7. The ultraviolet curable resin composition as set forth in claim 3, wherein a content of the compound (ii) is within a range of 0.1 to 10 mol % with respect to a total amount of the ethylenically unsaturated monomer component used to prepare the epoxy group containing polymer (a).

8. The ultraviolet curable resin composition as set froth in claim 1, wherein the ethylenically unsaturated monomer (i) includes glycidyl (meth)acrylate.

9. The ultraviolet curable resin composition as set forth in claim 1, wherein the diluent (D) includes an ethylenically unsaturated photopolymerizable monomer having, which contains 3 to 12 mol of a polymerizable unsaturated group in 1 kg thereof.

10. A photo solder resist ink including the ultraviolet curable resin composition as set forth in claim 1.

11. A printed circuit board with a permanent film formed by use of the photo solder resist ink as set froth in claim 10.

12. A dry film obtained by forming a film of the photo solder resist ink as set forth in claim 10 on a support.

13. A photo solder resist ink for manufacturing a flexible printed circuit board, which includes the ultraviolet curable resin composition as set forth in claim 1.

14. A flexible printed circuit board with a permanent film formed by use of the photo solder resist ink as set froth in claim 13.

15. A dry film obtained by forming a film of the ultraviolet curable resin composition as set forth in claim 1 on a support.

\* \* \* \* \*